(12) United States Patent
Kinoshita et al.

(10) Patent No.: US 8,441,304 B2
(45) Date of Patent: May 14, 2013

(54) HIGH-FREQUENCY SWITCH CIRCUIT

(75) Inventors: Yuta Kinoshita, Kanagawa (JP);
Tomonori Okashita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 33 days.

(21) Appl. No.: 13/082,913

(22) Filed: Apr. 8, 2011

(65) Prior Publication Data

US 2011/0254612 A1     Oct. 20, 2011

(30) Foreign Application Priority Data

Apr. 19, 2010   (JP) .................... 2010-096015

(51) Int. Cl.
*H03K 17/687*    (2006.01)

(52) U.S. Cl.
USPC ........................................ 327/427

(58) Field of Classification Search ........... 327/427, 327/429, 434, 436, 437
See application file for complete search history.

(56) References Cited

U.S. PATENT DOCUMENTS

| 2008/0079653 A1* | 4/2008 | Ahn et al. ................ 343/904 |
| 2008/0174357 A1 | 7/2008 | Matsuda |
| 2009/0181630 A1 | 7/2009 | Seshita et al. |

FOREIGN PATENT DOCUMENTS

| JP | 2007-073815 | 3/2007 |
| JP | 2008-181911 | 8/2008 |
| JP | 2008-263523 | 10/2008 |
| JP | 2009-194891 | 8/2009 |

* cited by examiner

*Primary Examiner* — Lincoln Donovan
*Assistant Examiner* — Sibin Chen
(74) *Attorney, Agent, or Firm* — Young & Thompson

(57) ABSTRACT

A high-frequency switch circuit according to the present invention includes at least a first switch connected between a common terminal and a first terminal, and a second switch connected between the common terminal and a second terminal. Each of the first and second switches includes a plurality of field-effect transistors connected in series and each having a body, a source, a drain, and a gate. A compensation capacitance that compensates a parasitic capacitance generated when the first switch is in an off-state is formed between the drain and the body or between the source and the body in the FET of the first switch. A compensation capacitance that compensates a parasitic capacitance generated when the second switch is in an off-state is formed between the drain and the body or between the source and the body in the FET of the second switch.

17 Claims, 11 Drawing Sheets

HIGH-FREQUENCY SWITCH CIRCUIT

CROSS-REFERENCE TO RELATED APPLICATIONS

This application is based upon and claims the benefit of priority from Japanese patent application No. 2010-096015, filed on Apr. 19, 2010, the disclosure of which is incorporated herein in its entirety by reference.

BACKGROUND

The present invention relates to a high-frequency switch circuit, and more particularly, to a high-frequency switch circuit having field-effect transistors.

There has been known a multi-port high-frequency switch circuit for switching connections between an antenna terminal and multi-port terminals of a multimode/multiband wireless communication device such as Global System for Mobile Communications (GSM) or Universal Mobile Telecommunications System (UMTS). Such a high-frequency switch circuit is required to be low in insertion loss and maintain linearity of an output signal even when a large signal is supplied. In general, as the high-frequency switch circuit that satisfies these performance requirements, a high-frequency switch circuit having field-effect transistors (hereinafter, FETs) formed by using GaAs has been used.

Meanwhile, in recent years, a metal-oxide-semiconductor field-effect transistor (hereinafter, MOSFET) formed by using Si has been proposed (refer to Japanese Unexamined Patent Application Publication No. 2009-194891). The use of the MOSFET greatly reduces a parasitic capacitance of a device and improves an insertion loss property of a switch, with the introduction of a Silicon-On-Insulator (SOI) technology. In this method, a plurality of MOSFETs are connected in series and in multistage, thereby preventing a malfunction when a large signal is supplied, and improving withstand voltage. However, the configuration in which the plurality of MOSFETs are connected in series and in multi-stage generates a second harmonic wave and a third harmonic wave.

FIG. 9 is a circuit diagram of a Single Pole Double Throw (SPDT) switch. Note that the actual multi-port high-frequency switch circuit is designed for multi-port switching, such as a Single Pole 4 Throw (SP4T) and an SP10T. However, the SPDT switch is described to simplify the explanation in this specification. In the SPDT switch shown in FIG. 9, a plurality of FETs (T111 to T114) are connected in series between an antenna terminal (an ANT terminal) and a port 1 terminal. Further, a plurality of FETs (T121 to T124) are connected in series between the ANT terminal and a port 2 terminal. Gates of the FETs (T111 to T114) that are connected between the ANT terminal and the port 1 terminal are connected to each other via resistor elements and supplied with a common control signal 131. Similarly, gates of the FETs (T121 to T124) that are connected between the ANT terminal and the port 2 terminal are connected to each other via resistor elements and supplied with a common control signal 132.

In general, a selector switch selects a conduction of one of the plurality of ports. Therefore, the FETs (T121 to T124) that are connected between the ANT terminal and the port 2 terminal become off-state when the FETs (T111 to T114) that are connected between the ANT terminal and the port 1 terminal become on-state, for example. On the other hand, the FETs (T111 to T114) that are connected between the ANT terminal and the port 1 terminal become off-state when the FETs (T121 to T124) that are connected between the ANT terminal and the port 2 terminal become on-state.

FIG. 10 is a cross-sectional view showing a structure of the FET used for such a switch (refer to Japanese Unexamined Patent Application Publication No. 2009-194891). The FET shown in FIG. 10 is formed by using the SOI technology. The FET shown in FIG. 10 includes a Si substrate 112, an embedded oxide film layer 113 formed on the Si substrate 112, a body region (an SOI layer) 116 formed on the embedded oxide film layer 113, a source region 121, a drain region 122, a gate oxide film 115 formed on the body region 116, and a gate electrode 123 formed on the gate oxide film 115. The FETs are separated by element isolation layers 114. In general, the high-frequency switch circuit is designed so as to be symmetrical to an input and an output. Therefore, the FET shown in FIG. 10 has the structure in which the source region 121 and the drain region 122 are symmetrical to the center of the gate electrode 123 and the body region 116.

In the high-frequency switch circuit, as shown in FIG. 10, the FET is generally configured to have a large gate width so as to reduce the on resistance of the conducting port. Therefore, a multi-finger type FET in which the gate electrode 123, the drain region 122, and the source region 121 are arranged as shown in FIG. 11 is widely used. The multi-finger type FET shown in FIG. 11 forms an FET by connecting a plurality of unit devices in parallel.

In addition, Japanese Unexamined Patent Application Publication No. 2007-073815 discloses a semiconductor device that can improve distortion characteristics. The semiconductor device disclosed in this document is used for a high-frequency switch circuit in which a high frequency signal via either a source electrode or a drain electrode in a multi-gate FET is input or output via the other electrode, and passing or blocking of the high frequency signal is controlled by the electric potentials of control terminals connected to multiple gate electrodes. In this technique, the length of a source side pent roof in a first gate nearest to the source electrode and the length of a drain side pent roof in a third gate nearest to the drain electrode are longer than that of the other pent roof in the gate electrode and they constitute an additional capacity.

In addition, Japanese Unexamined Patent Application Publication No. 2008-263523 discloses a technique in which a second-order harmonic distortion of a high frequency signal transmitted via a high-frequency switch circuit is reduced. In the high-frequency switch circuit disclosed in this document, FETs constituting a receiving side transfer circuit is constituted as a serial structure at odd-numbered stages. Each FET stage is constituted of a parallel body of MOSFETs where positions of a source electrode and a drain electrode are exchanged and the gate width of each of the MOSFETs is reduced to a half in comparison with the case of constituting the receiving side transfer circuit of one line of MOSFETs.

In addition, Japanese Unexamined Patent Application Publication No. 2008-181911 discloses a semiconductor device in which linearity is secured when turning on the semiconductor device, and deterioration in breaking characteristics is suppressed when turning off the semiconductor device. The semiconductor device disclosed in this document has a plurality of terminals and a switch having a plurality of FETs connected among the plurality of terminals. The gate width of first FETs connected to at least one of the plurality of terminals of the plurality of FETs is larger than the gate width of second FETs connected to the subsequent stage of the first FETs of the plurality of FETs. A sum of length of a source electrode and a drain electrode of the first FETs in a direction perpendicular to the gate width of the first FETs is smaller than a sum of length of a source electrode and a drain electrode of the second FETs in a direction perpendicular to the gate width of the second FETs.

SUMMARY

In the SPDT switch shown in FIG. 9, the FETs (T121 to T124) that are connected between the ANT terminal and the port 2 terminal become off-state when the FETs (T111 to T114) that are connected between the ANT terminal and the port 1 terminal become on-state, for example. In this case, a parasitic capacitance is generated between the ANT terminal and the port 2 terminal due to the FETs (T121 to T124) that are in the off-state. The present inventors have found a problem that a second-order harmonic distortion is generated in a high-frequency switch circuit. This problem occurs similarly in the case that the FETs (T111 to T114) that are connected between the ANT terminal and the port 1 terminal are in the off-state and the FETs (T121 to T124) that are connected between the ANT terminal and the port 2 terminal are in the on-state.

Hereinafter, the problem to be solved by the present invention is described in detail. FIG. 12 is an equivalent circuit diagram when the FETs (T121 to T124) that are in the off-state are connected between the ANT terminal and the port 2 terminal. In this case, the port 2 is connected to a ground (GND) via an input/output circuit of a power amplifier. Here, an impedance of the input/output circuit of the power amplifier is lower than that of the parasitic capacitance of the FETs (T121 to T124) that are in the off-state and connected between the ANT terminal and the port 2 terminal. Therefore, it is assumed that the port 2 is directly connected to the ground. Further, FIG. 12 shows the equivalent circuit diagram of the FET (T121) shown in FIG. 9, while the FETs (T122 to T124) that are connected in multistage have the same configuration as the FET (T121).

Generally, a drain region and a source region of an FET used for a switch are arranged symmetrical to the center of a gate electrode and a body region. Therefore, as shown in FIG. 12, an overlap capacitance Cgd121 between a drain D121 and a gate G121 is equal to an overlap capacitance Cgs121 between a source S121 and the gate G121. Further, a junction capacitance Cdb121 between the drain D121 and a body B121 is equal to a junction capacitance Csb121 between the source S121 and the body B121.

For this reason, as far as only these four parasitic capacitances are considered, a drain-to-source capacitance Cds is expressed as an even function with respect to a drain-to-source voltage Vds, as shown in FIG. 13, when a gate resistance Rg121 and a body resistance Rb121 are high enough. When the drain-to-source capacitance Cds is expressed as a function with respect to the drain-to-source voltage Vds, the function is expressed as follows.

$$Cds = a_0 + a_2 Vds^2 + a_4 Vds^4 + \quad \text{formula 1}$$

At this time, the relationship between the drain-to-source voltage Vds and a drain-to-source current I of the FET that is in the off-state is expressed as follows.

$$I = \frac{dQ}{dt} = \frac{d(Cds \cdot Vds)}{dt} \quad \text{formula 2}$$

Assuming that $V_0$ is the voltage magnitude of an input signal and f is frequency, the drain-to-source voltage Vds of the FET that is in the off-state is expressed as follows.

$$Vds = V_0 e^{j(2\pi f)t} \quad \text{formula 3}$$

By substituting this formula 3 into the formula 2, the drain-to-source current I of the FET that is in the off-state is expressed as follows.

$$I = j \times 2\pi f V_0 \times (a_0 \cdot e^{j2\pi(f)t} + 3a_2 \cdot e^{j2\pi(3f)t} + 5a_4 \cdot e^{j2\pi(5f)t} + \ldots) \quad \text{formula 4}$$

As shown in the formula 4, the FET that is in the off-state does not pass an electric current having a frequency component that is an even multiple of the input signal frequency. Thereby, a second-order harmonic power becomes zero. That is, the second-order harmonic distortion is not generated when the drain-to-source capacitance Cds is expressed as an even function with respect to the drain-to-source voltage Vds.

Meanwhile, in the actual FET device, as shown in FIGS. 10 and 12, a parasitic capacitance Cbg121 is present between the body region 116 (B121) and the ground due to the embedded oxide film 113. Therefore, in addition to the above-mentioned four parasitic capacitances (Cgd121, Cgs121, Cdb121, and Csb121), the parasitic capacitance Cbg121 between the body region 116 (B121) and the ground must be considered. In this case, as shown in FIG. 14, the drain-to-source capacitance Cds is expressed as a formula that has not only an even function but also an odd function component with respect to the drain-to-source voltage Vds. For this reason, the second-order harmonic distortion is generated in the high-frequency switch circuit.

A first aspect of the present invention is a high-frequency switch circuit including: a first switch that is connected between a common terminal and a first terminal; and a second switch that is connected between the common terminal and a second terminal. Each of the first and second switches includes a plurality of field-effect transistors connected in series and each having a body, a source, a drain, and a gate. A compensation capacitance that compensates a parasitic capacitance generated when the first switch is in an off-state is formed between the drain and the body or between the source and the body in at least one of the plurality of field-effect transistors of the first switch. A compensation capacitance that compensates a parasitic capacitance generated when the second switch is in an off-state is formed between the drain and the body or between the source and the body in at least one of the plurality of field-effect transistors of the second switch.

Thus, in the high-frequency switch circuit according to the first aspect of the present invention, the compensation capacitance that compensates the parasitic capacitance generated when the first switch is in the off-state is formed between the drain and the body or between the source and the body. Further, the compensation capacitance that compensates the parasitic capacitance generated when the second switch is in the off-state is formed between the drain and the body or between the source and the body. Therefore, the drain-to-source capacitance can be made nearly symmetrical with respect to sign inversion of the drain-to-source voltage. This makes it possible to minimize the odd function component of the drain-to-source capacitance, and to suppress the generation of the second-order harmonic distortion.

According to the present invention, it is possible to provide a high-frequency switch circuit capable of suppressing generation of a second-order harmonic distortion.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Embodiments of the present invention will be described below with reference to the accompanying drawings.

Figure 1:
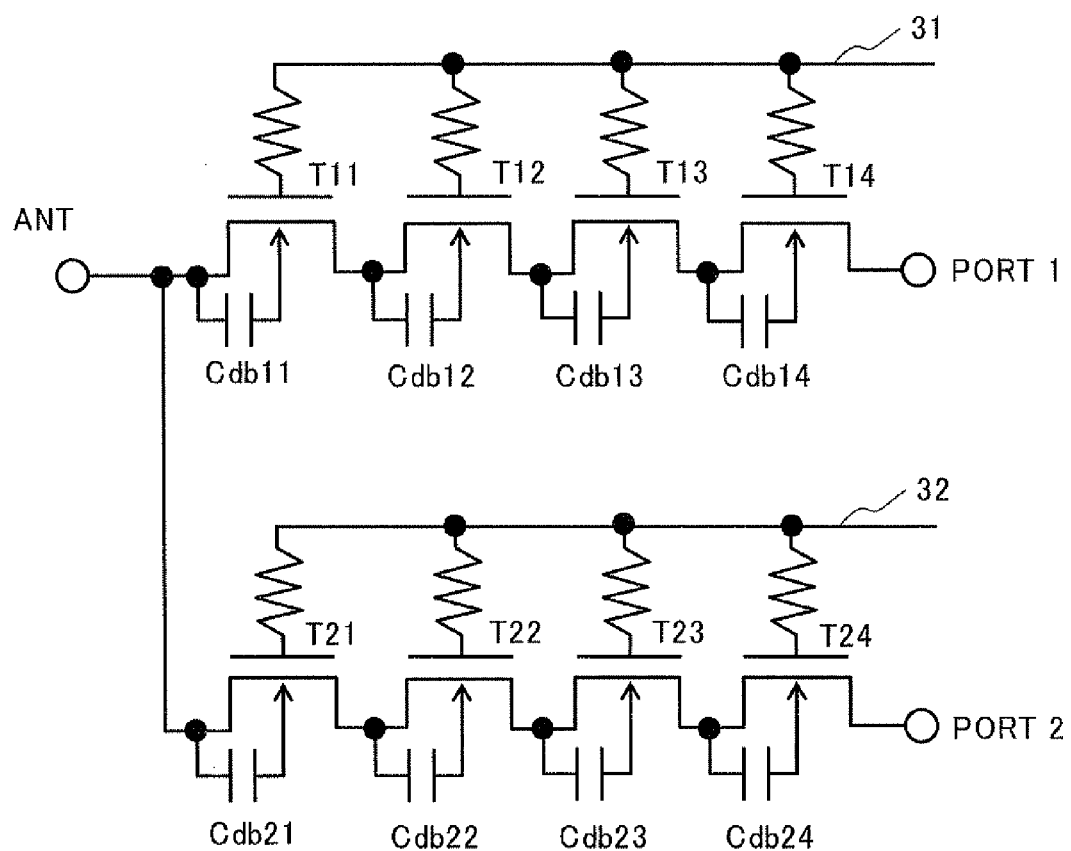
FIG. 1 is a circuit diagram of a high-frequency switch circuit according to a first embodiment.

FIG. 1 is a circuit diagram of a high-frequency switch circuit according to a first embodiment of the present invention. The high-frequency switch circuit according to this embodiment includes at least a first switch and a second switch. The first switch is connected between a common terminal (an ANT terminal) and a first terminal (a port 1 terminal). The second switch is connected between the common terminal and a second terminal (a port 2 terminal). In this embodiment, a Single Pole Double Throw (SPDT) switch is described, for example. However, this invention can similarly be applied to other high-frequency switch circuits such as a Single Pole 4 Throw (SP4T) and an SP10T. That is, the high-frequency switch circuit according to this embodiment can be applied to a high-frequency switch circuit that switches on-state and off-state of any switch among switches connected between N (N is an integer) number of input terminals and M (M is an integer) number of output terminals.

The first switch includes a plurality of FETs (T11 to T14) connected in series. The second switch includes a plurality of FETs (T21 to T24) connected in series. Gates of the FETs (T11 to T14) connected between the ANT terminal and the port 1 terminal are connected to each other via resistor elements and supplied with a common control signal 31. Similarly, gates of the FETs (T21 to T24) connected between the ANT terminal and the port 2 terminal are connected to each other via resistor elements and supplied with a common control signal 32.

The high-frequency switch circuit shown in FIG. 1 selects a conduction of one of the plurality of ports (the port 1, the port 2). Therefore, the FETs (T21 to T24) that are connected between the ANT terminal and the port 2 terminal become off-state when the FETs (T11 to T14) that are connected between the ANT terminal and the port 1 terminal become on-state, for example. On the other hand, the FETs (T11 to T14) that are connected between the ANT terminal and the port 1 terminal become off-state when the FETs (T21 to T24) that are connected between the ANT terminal and the port 2 terminal become on-state.

In the high-frequency switch circuit according to this embodiment, each of the FETs (T11 to T14) of the first switch has a compensation capacitance (Cdb11 to Cdb14) formed between the drain and the body or between the source and the body. Each of the compensation capacitances (Cdb11 to Cdb14) compensates a parasitic capacitance generated between the body and the ground of each of the FETs (T11 to T14) when the first switch is in the off-state. Further, each of the FETs (T21 to T24) of the second switch has a compensation capacitance (Cdb21 to Cdb24) formed between the drain and the body or between the source and the body. Each of the compensation capacitances (Cdb21 to Cdb24) compensates a parasitic capacitance generated between the body and the ground of each of the FETs (T21 to T24) when the second switch is in the off-state.

Figure 6:
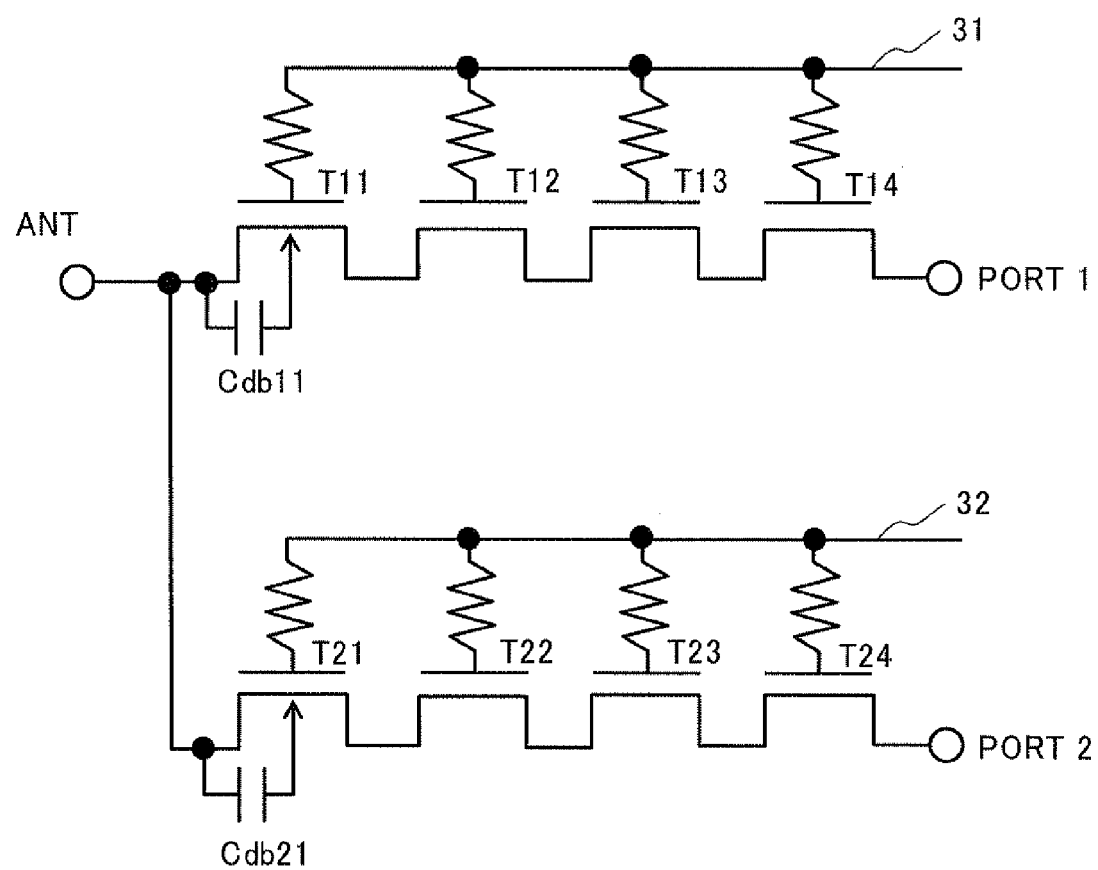
FIG. 6 is a circuit diagram showing another aspect of the high-frequency switch circuit according to the first embodiment.

In this embodiment, the case in which the compensation capacitance is formed between the drain and the body is described, for example. However, the same holds true for the case in which the compensation capacitance is formed between the source and the body. Further, in the high-frequency switch circuit according to this embodiment, the compensation capacitances only need to be formed in at least one of the FETs (T11 to T14) that configure the first switch and in at least one of the FETs (T21 to T24) that configure the second switch, respectively. Specifically, as shown in FIG. 6, the compensation capacitances may be formed in the FET (T11) that configures the first switch and in the FET (T21) that configures the second switch, respectively. In the configuration shown in FIG. 6, compensation capacitances corresponding to the compensation capacitances formed in each of the FETs shown in FIG. 1 can be formed in only one FET. This makes it possible to simplify the circuit configuration.

Figure 2:
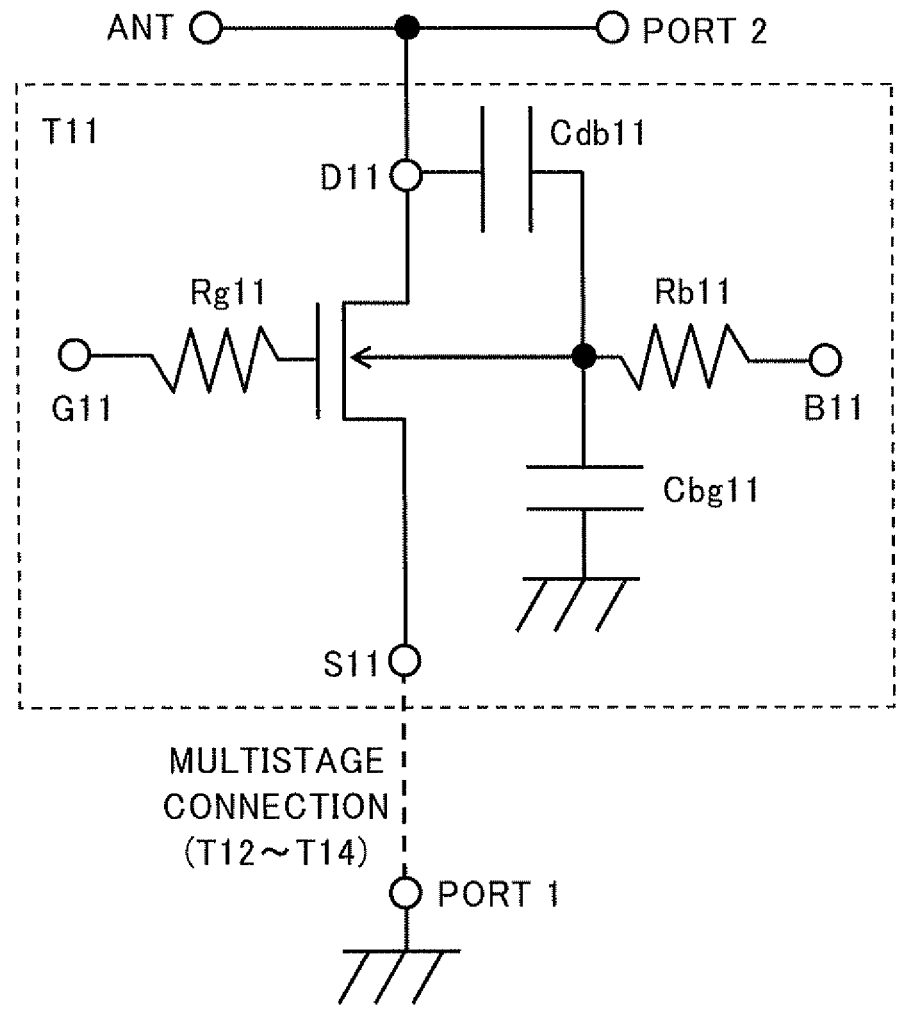
FIG. 2 is an equivalent circuit diagram of an FET that configures the high-frequency switch circuit according to the first embodiment.

FIG. 2 is an equivalent circuit diagram of an FET that configures the high-frequency switch circuit according to this embodiment. More specifically, FIG. 2 is the equivalent circuit diagram when the FETs (T11 to T14) that are in the off-state are connected between the ANT terminal and the port 1 terminal in multistage. In this case, the port 1 is connected to a ground (GND) via an input/output circuit of a power amplifier. Here, an impedance of the input/output circuit of the power amplifier is lower than that of the parasitic capacitance of the FETs (T11 to T14) that are in the off-state and connected between the ANT terminal and the port 1 terminal. Therefore, it is assumed that the port 1 is directly connected to the ground.

Further, FIG. 2 shows the equivalent circuit diagram of the FET (T11) on behalf of the FETs (T11 to T14), while the other FETs (T12 to T14) that are connected in multistage have the same configuration as the FET (T11). FIG. 2 shows the case in which the FETs (T11 to T14) that configure the first switch are in the off-state and the FETs (T21 to T24) that configure the second switch are in the on-state, for example. However, the same holds true for the case in which the FETs (T11 to T14) that configure the first switch are in the on-state and the FETs (T21 to T24) that configure the second switch are in the off-state.

As shown in FIG. 2, a parasitic capacitance Cbg11 is present between a body B11 of the FET (T11) and the ground due to an embedded oxide film. Rg11 represents the gate resistance and Rb11 represents the body resistance. Meanwhile, as described above, it can be assumed that the port 1 terminal of the FETs (T11 to T14) that are in the off-state and connected in multistage is directly connected to the ground under the actual use conditions of the switch. In this case, the symmetry of the capacitances of the FETs (T11 to T14), which are in the off-state and connected between the ANT terminal and the ground, with respect to a voltage applied between the ANT terminal and the ground is broken due to the parasitic capacitances (e.g., Cbg11) that are attributed to the embedded oxide film. Therefore, the ANT terminal-to-ground capacitances of the FETs (T11 to T14) that are in the off-state and connected in multistage have not only an even function component but also an odd function component with respect to the voltage applied between the ANT terminal and the ground.

In the high-frequency switch circuit according to this embodiment, the compensation capacitance Cdb11 is formed between a drain D11 and the body B11. Note that the compensation capacitances of the other FETs (T12 to T14) are formed in the same manner as the compensation capacitance of the FET (T11). The compensation capacitances (e.g., Cdb11) evenly compensate the symmetry breaking in which the symmetry of the capacitances of the FETs (T11 to T14), which are in the off-state, with respect to the voltage applied between the ANT terminal and the ground is broken due to the parasitic capacitances (e.g., Cbg11).

That is, the compensation capacitances each formed between the drain and the body of the FETs (T11 to T14) make it possible to evenly absorb the symmetry breaking due to the parasitic capacitances. In other words, it is possible to minimize the odd function component of the FETs (T11 to T14) that are in the off-state and connected in multistage between the ANT terminal and the ground with respect to the voltage applied between the ANT terminal and the ground. This makes it possible to minimize the generation of the second-order harmonic distortion. Note that the compensation capacitances may be formed in at least one of the FETs (T11 to T14).

Figure 5:
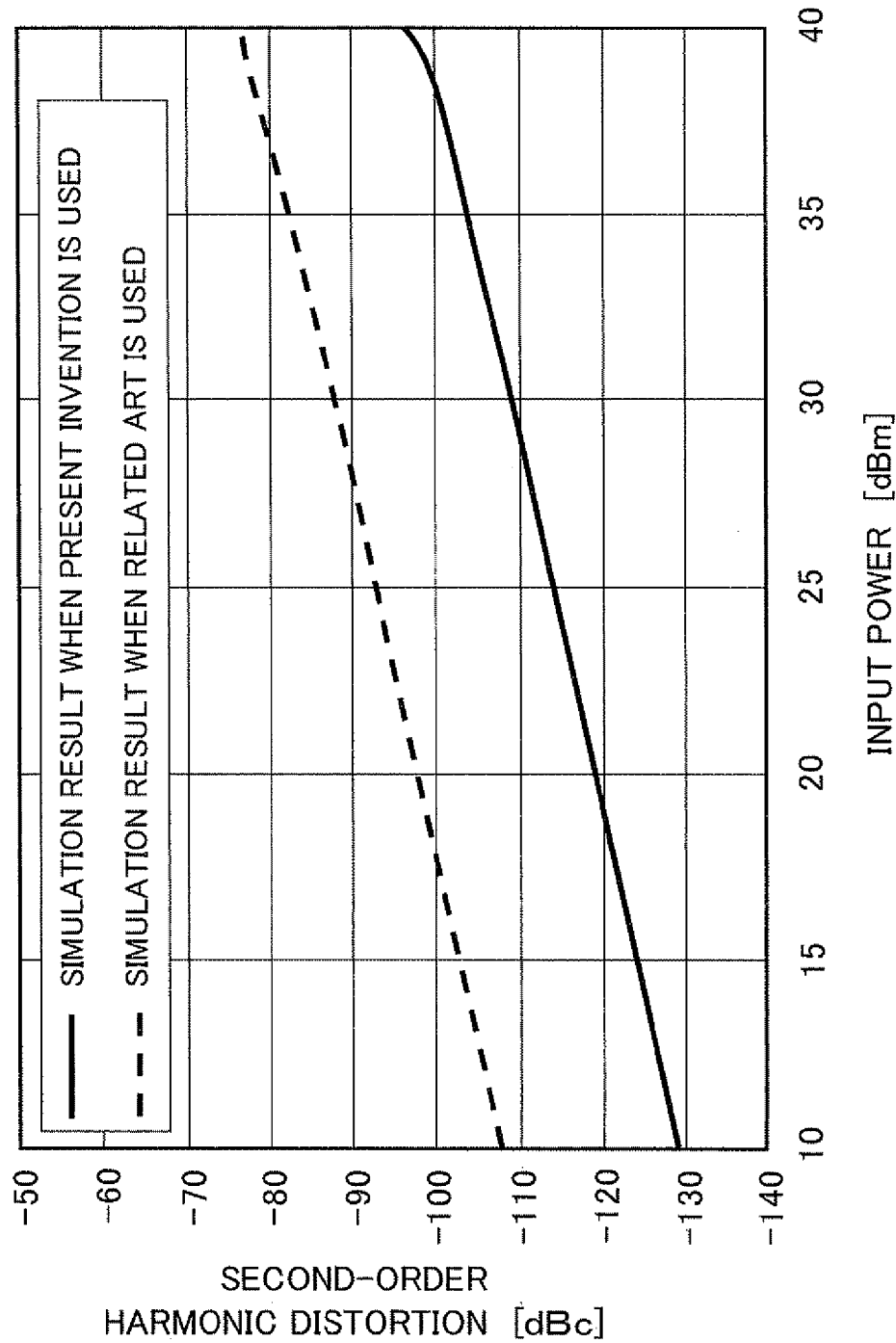
FIG. 5 is a graph showing simulation results corresponding to the relationship between an input power and a second-order harmonic distortion of the high-frequency switch circuit according to the first embodiment.

FIG. 5 is a diagram showing simulation results corresponding to the relationship between the input power and the second-order harmonic distortion of the high-frequency switch circuit according to this embodiment. FIG. 5 shows the simulation results of the high-frequency switch circuit when the compensation capacitances are formed in the FETs (T11 to T14 and T21 to T24). In FIG. 5, the longitudinal axis indicates the second-order harmonic distortion [dBc] (i.e., a second-order harmonic power [dBm]—an input power [dBm]). The horizontal axis indicates the input power [dBm]. In FIG. 5, the simulation result of the high-frequency switch circuit according to this embodiment is indicated by a solid line, while the simulation result of the high-frequency switch circuit according to the related art is indicated by a dashed line.

In the simulation result of the high-frequency switch circuit according to the related art, a second-order harmonic distortion of about −83 dBc is generated when the input power is 35 dB. Meanwhile, in the simulation result of the high-frequency switch circuit according to this embodiment, a second-order harmonic distortion of about −105 dBc is generated when the input power is 35 dB. Therefore, it is possible to minimize the odd function component due to the parasitic capacitances between the body and the ground by adding the compensation capacitances between the drain and the body of each FET. This makes it possible to minimize the generation of the second-order harmonic distortion.

Figure 3A:
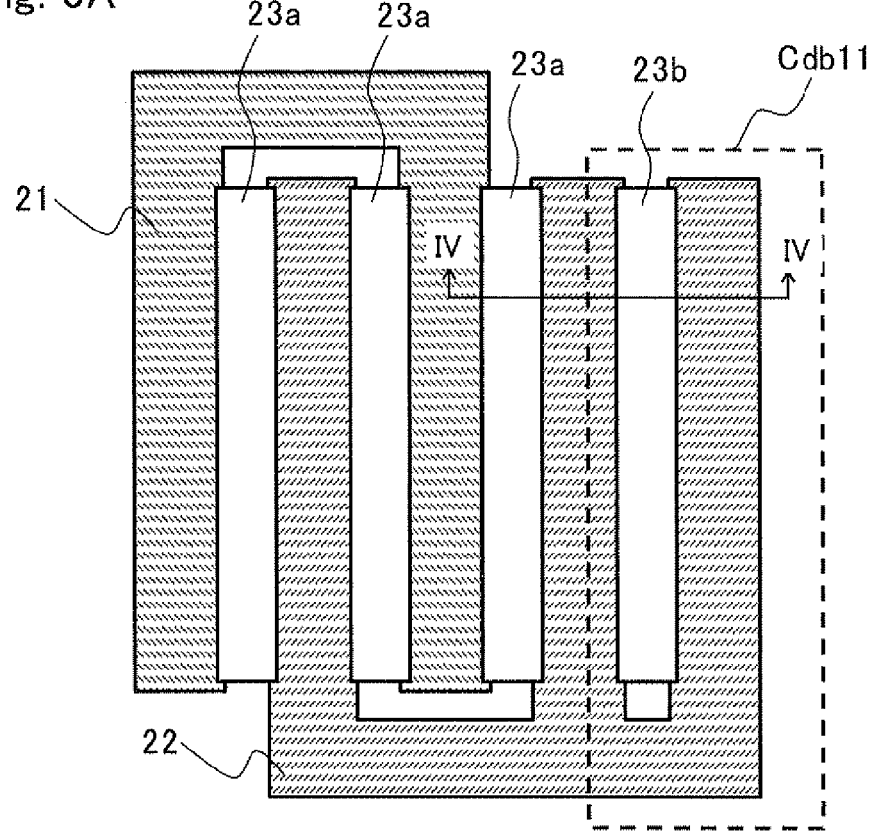
FIG. 3A is a top view showing a structure of the FET that configures the high-frequency switch circuit according to the first embodiment.
Figure 3B:
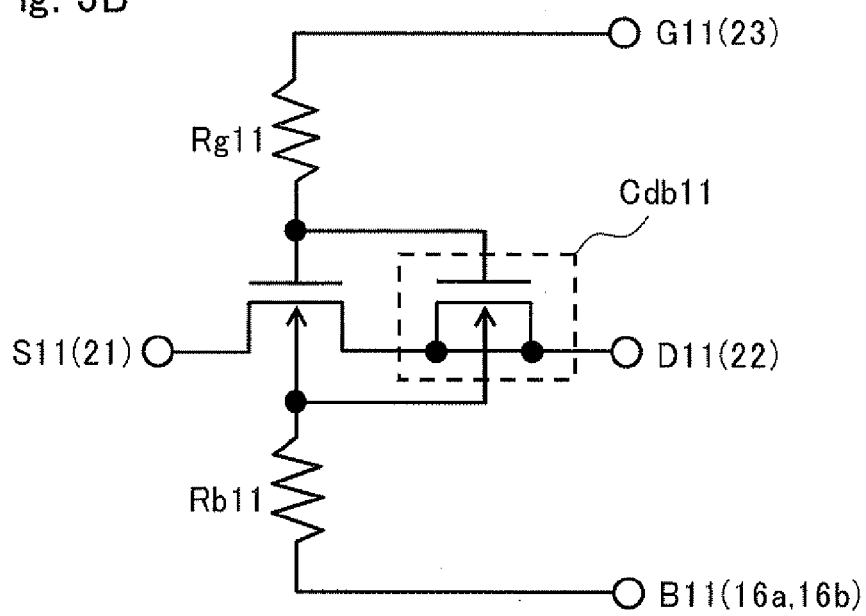
FIG. 3B is an equivalent circuit diagram of the FET shown in FIG. 3A.
Figure 4:
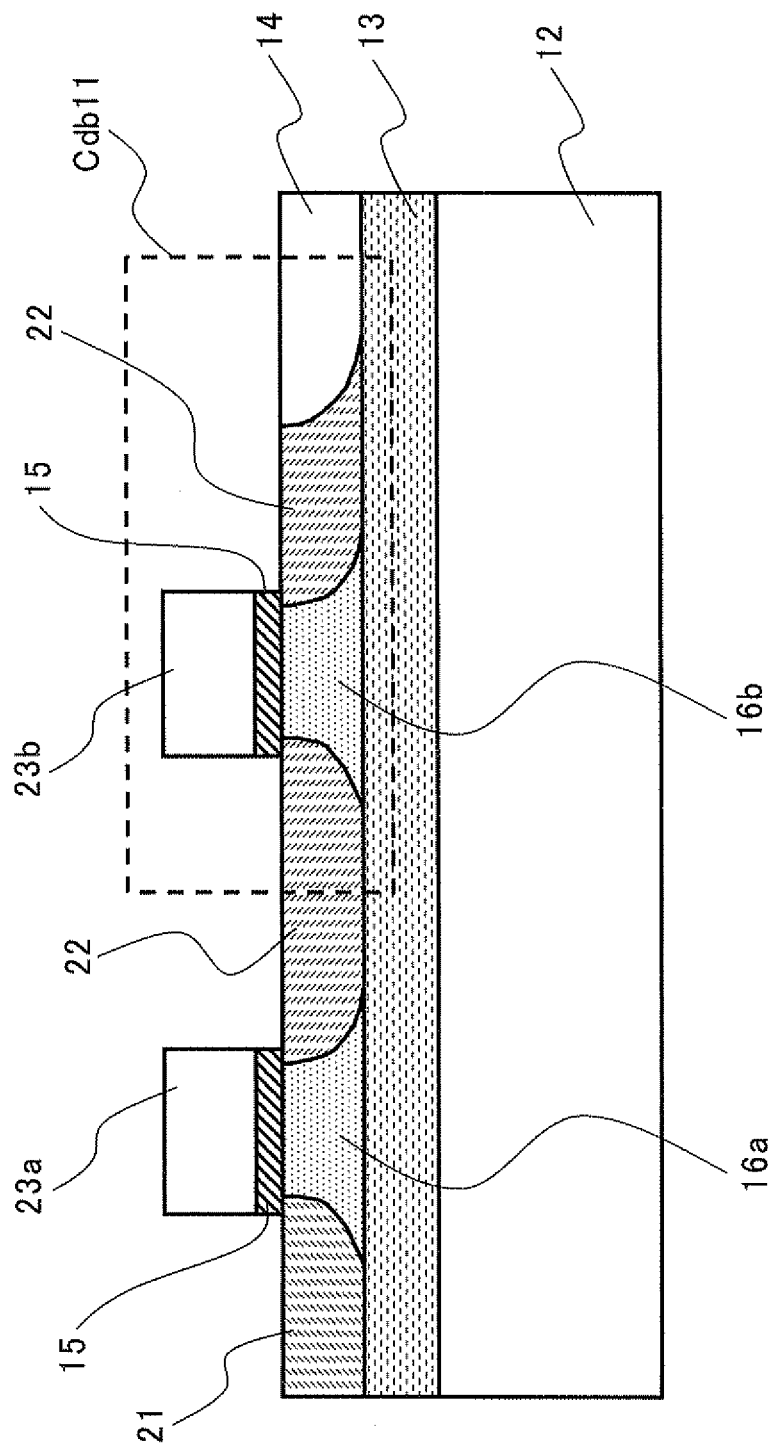
FIG. 4 is a cross-sectional view showing a structure of the FET shown in FIG. 3A.

Next, the technique for forming the compensation capacitance in the high-frequency switch circuit according to this embodiment will be described. Hereinafter, the FET (T11) is described on behalf of the FETs (T11 to T14), for example. FIG. 3A is a top view showing a structure of the FET that configures the high-frequency switch circuit according to this embodiment. FIG. 3B is an equivalent circuit diagram of the FET shown in FIG. 3A. FIG. 4 is a cross-sectional view showing the structure of the FET shown in FIG. 3A taken along the line IV-IV. As shown in FIG. 4, the FET that configures the high-frequency switch circuit according to this embodiment is formed by using an SOI technique, for example.

The FET shown in FIGS. 3 and 4 includes a Si substrate 12, an embedded oxide film layer 13 formed on the Si substrate 12, and body regions (SOI layer) 16a, 16b formed on the embedded oxide film layer 13. A source electrode 21 and a drain electrode 22 are formed on both sides of the body region 16a. The drain electrode 22 is formed on both sides of the body region 16b. Further, the FET shown in FIG. 4 includes gate oxide films 15 formed on the body regions 16a, 16b, and gate electrodes 23a, 23b formed on the gate oxide films 15. The gate oxide films 15 and the gate electrodes 23a, 23b are formed in such a way that each end of the gate oxide films 15 and the gate electrodes 23a, 23b covers a part of each of the source electrode 21 and the drain electrode 22. Further, the FETs (i.e., each of the FETs (T11 to T14)) are separated by element isolation layers 14.

As shown in FIG. 3A, the FET (a unit device such as the FET (T11)) that configures the high-frequency switch circuit according to this embodiment is a multi-finger type field-effect transistor in which a plurality of FETs are connected in parallel and each include the body regions 16a, 16b, the source electrodes 21, the drain electrodes 22, and the gate electrodes 23a, 23b. Specifically, as shown in FIG. 3A, the source electrodes 21, the drain electrodes 22, and the gate electrodes 23a, 23b are arranged in a comb shape.

In the FET that configures the high-frequency switch circuit according to this embodiment, as shown in FIG. 3A, the compensation capacitance Cdb11 is formed by arranging the drain electrodes 22 on the both sides of the gate electrode 23b. In other words, the compensation capacitance Cdb11 can be formed between the drain D11 and the body B11 as shown in the equivalent circuit diagram of FIG. 3B by forming the drain electrodes 22 on the both sides of the body region 16b as shown in FIG. 4. That is, a depletion layer is generated at the body region 16b by increasing a contact area between the drain electrodes 22 and the body region 16b. This makes it possible to form the compensation capacitance Cdb11.

As described above, in the high-frequency switch circuit according to this embodiment, the compensation capacitance Cdb11 that compensates the parasitic capacitance Cbg11 due to the embedded oxide film is formed between the drain D11 and the body B11. This configuration makes it possible to evenly absorb the symmetry breaking in which the symmetry of the capacitances of the FETs (T11 to T14), which are in the off-state and connected between the ANT terminal and the ground, with respect to the voltage applied between the ANT terminal and the ground is broken due to the parasitic capacitance Cbg11. In other words, it is possible to minimize the odd function component of the FETs (T11 to T14), which are in the off-state and connected in multistage between the ANT terminal and the ground, with respect to the voltage applied between the ANT terminal and the ground. This makes it possible to minimize the generation of the second-order harmonic distortion.

Second Embodiment

Next, a second embodiment of the present invention will be described. A high-frequency switch circuit according to this embodiment is similar to that of the first embodiment except that the method for forming a compensation capacitance is different from that of the first embodiment. Thus, a duplicated description will be omitted.

Figure 7A:
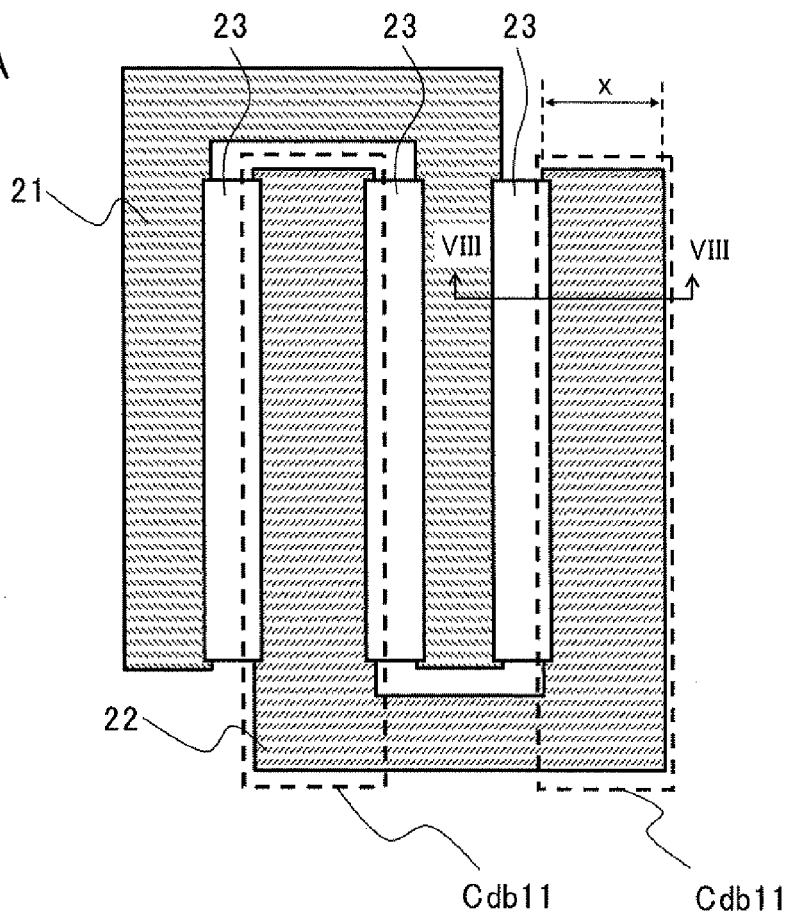
FIG. 7A is a top view showing a structure of an FET that configures a high-frequency switch circuit according to a second embodiment.
Figure 7B:
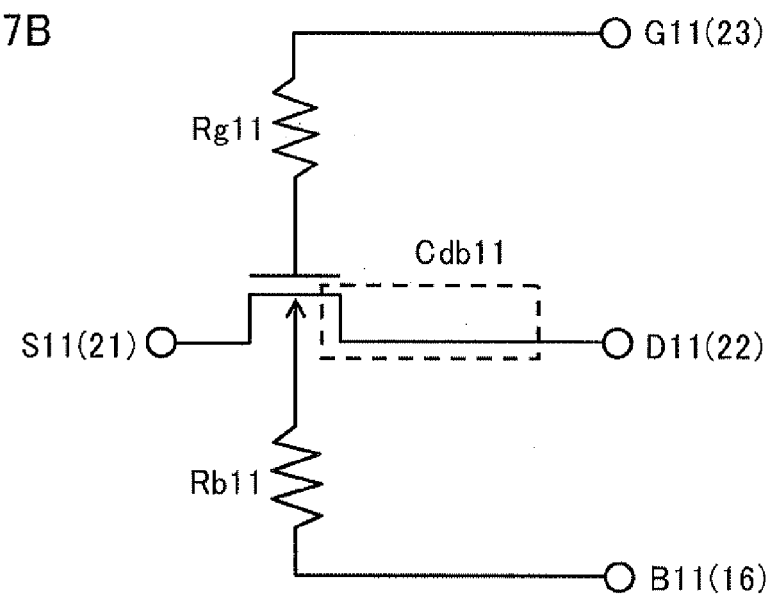
FIG. 7B is an equivalent circuit diagram of the FET shown in FIG. 7A.
Figure 8:
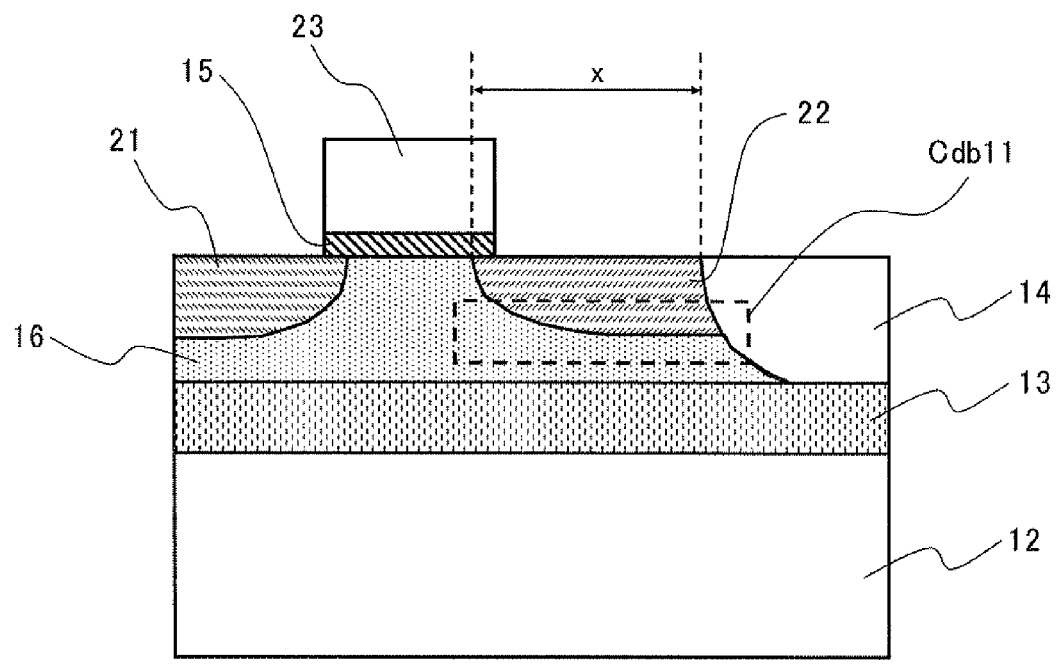
FIG. 8 is a cross-sectional view showing a structure of the FET shown in FIG. 7A.
Figure 9:
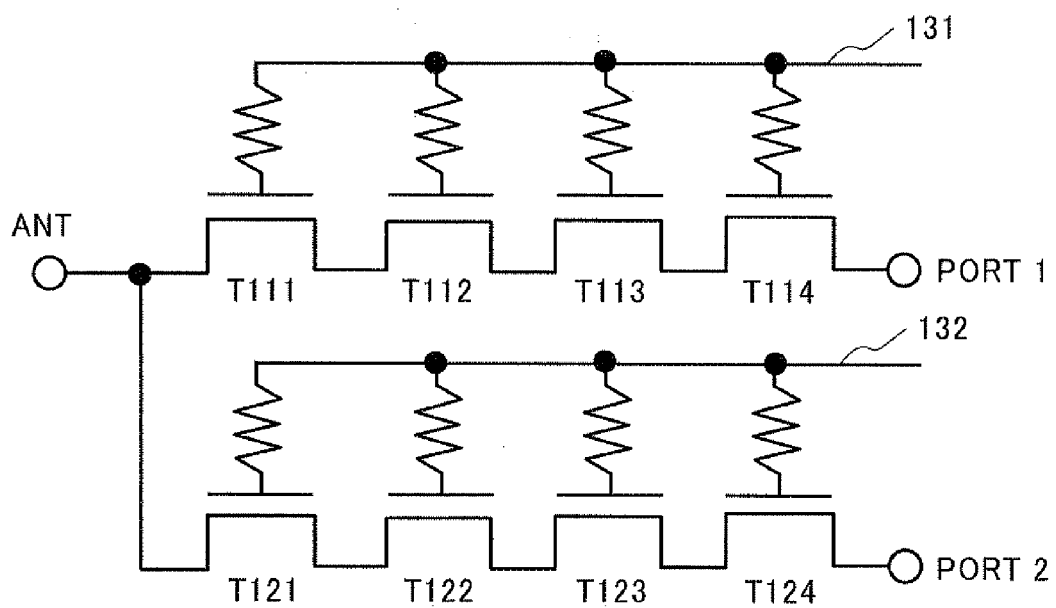
FIG. 9 is a circuit diagram of a high-frequency switch circuit according to a related art.
Figure 10:
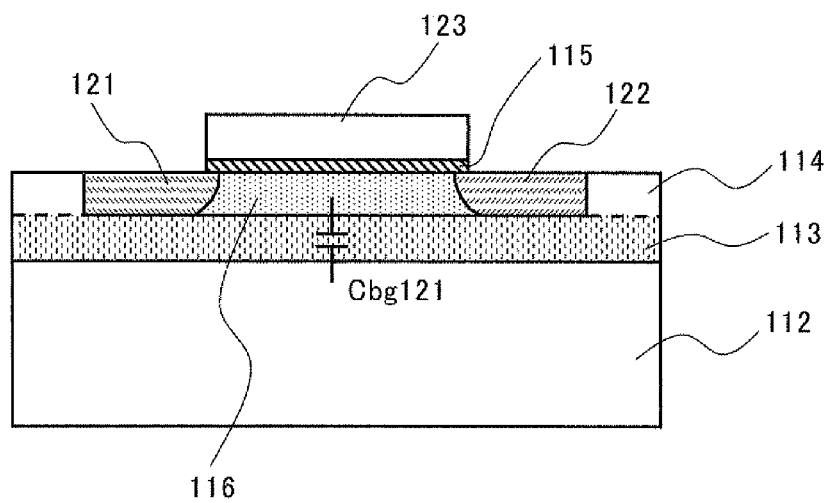
FIG. 10 is a cross-sectional view showing a structure of an FET that configures the high-frequency switch circuit according to the related art.
Figure 11:
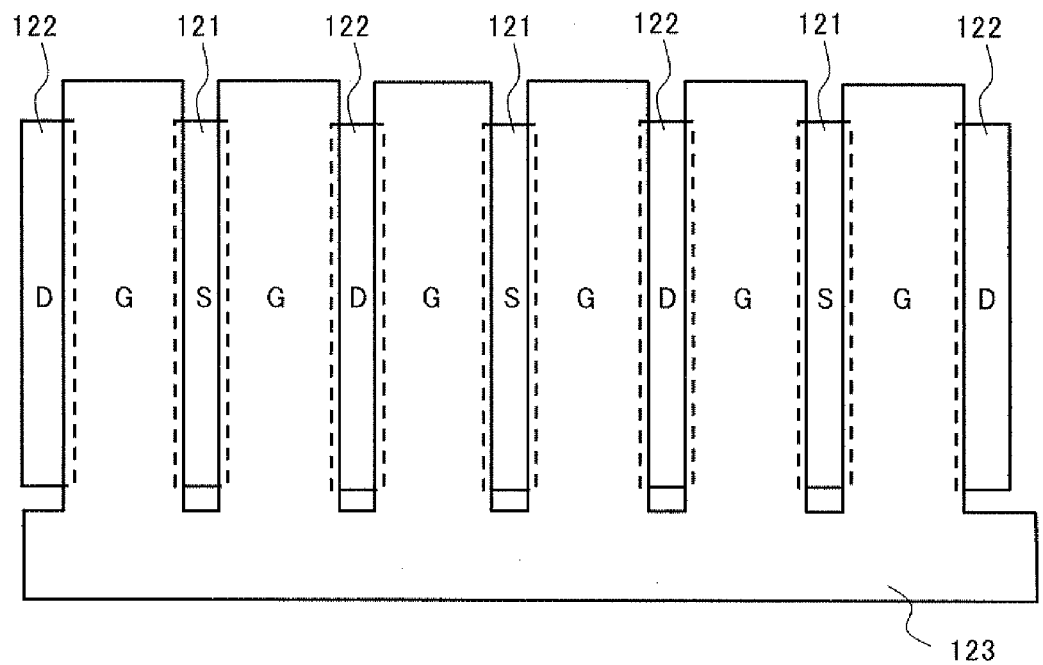
FIG. 11 is a top view showing a structure of a multi-finger type FET that configures the high-frequency switch circuit according to the related art.
Figure 12:
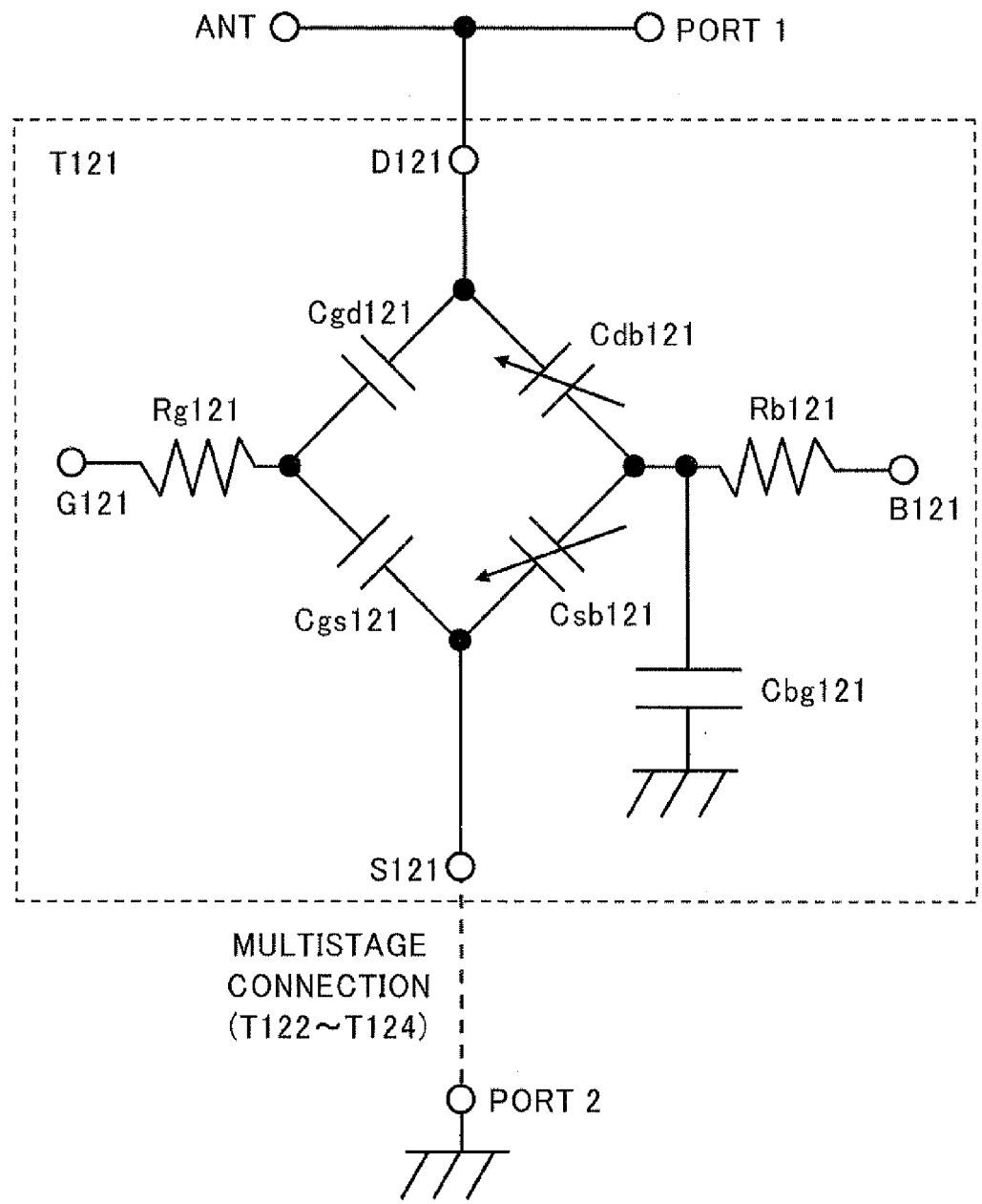
FIG. 12 is an equivalent circuit diagram when FETs (T121 to T124) that are in the off-state are connected between an ANT terminal and a port 2 terminal.
Figure 13:
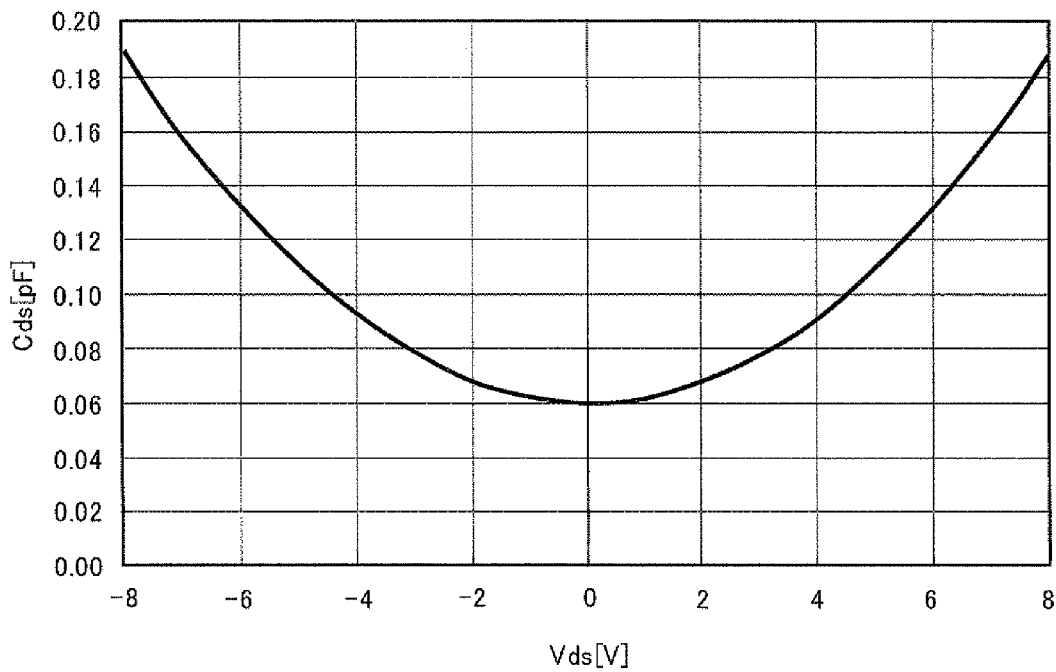
FIG. 13 is a graph illustrating a relationship between a drain-to-source capacitance Cds and a drain-to-source voltage Vds in the FET in which a parasitic capacitance Cbg is not considered.
Figure 14:
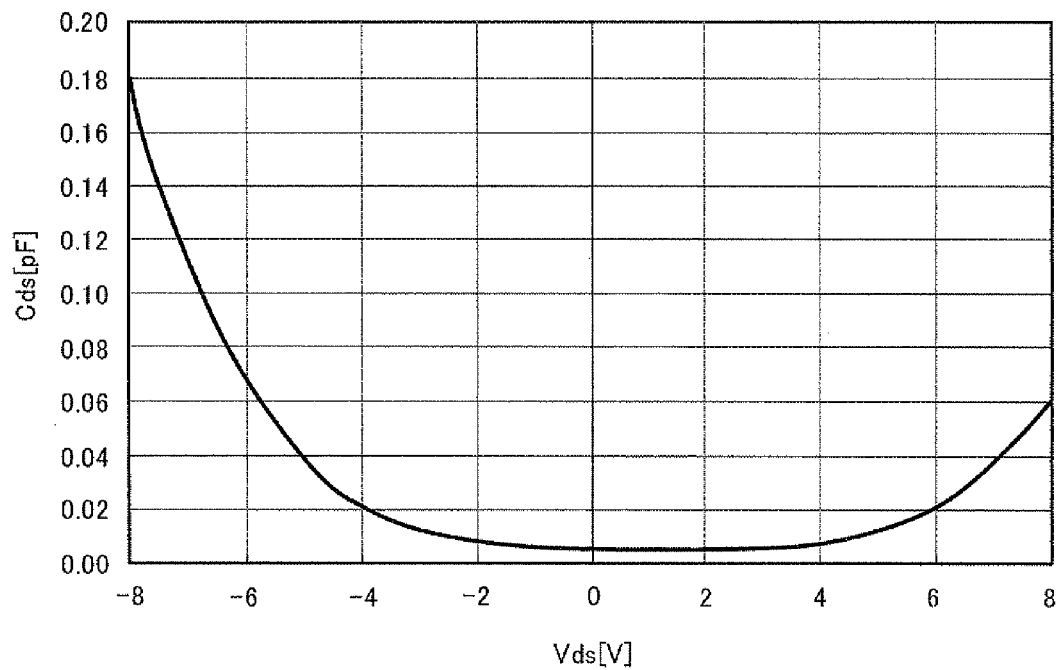
FIG. 14 is a diagram illustrating a relationship between the drain-to-source capacitance Cds and the drain-to-source voltage Vds in the FET having the parasitic capacitance Cbg.

FIG. 7A is a top view showing a structure of a FET that configures the high-frequency switch circuit according to this embodiment. FIG. 7B is an equivalent circuit diagram of the FET shown in FIG. 7A. FIG. 8 is a cross-sectional view showing the structure of the FET shown in FIG. 7A taken along the line VIII-VIII. As shown in FIG. 8, the FET that configures the high-frequency switch circuit according to this embodiment is also formed by using the SOI technique.

The FET shown in FIGS. 7 and 8 includes a Si substrate 12, an embedded oxide film layer 13 formed on the Si substrate 12, and a body region (SOI layer) 16 formed on the embedded oxide film layer 13. A source electrode 21 and a drain electrode 22 are formed on the body region 16 and on both sides of the body region 16. Specifically, in this embodiment, the body region 16 of the FET is formed over the region where the source electrode 21 is formed and the region where the drain electrode 22 is formed. Further, the FET shown in FIG. 8 includes a gate oxide film 15 formed on the body region 16, and a gate electrode 23 formed on the gate oxide film 15. The gate oxide film 15 and the gate electrode 23 are formed in such a way that each end of the gate oxide film 15 and the gate electrode 23 covers a part of each of the source electrode 21 and the drain electrode 22. Further, the FETs (i.e., each of the FETs (T11 to T14)) are separated by element isolation layers 14.

As shown in FIG. 7A, the FET (a unit device such as FET (T11)) that configures the high-frequency switch circuit according to this embodiment is a multi-finger type field-effect transistor in which a plurality of FETs are connected in parallel and each include the body region 16, the source electrodes 21, the drain electrodes 22, and the gate electrodes 23. That is, as shown in FIG. 7A, the source electrodes 21, the drain electrodes 22, and the gate electrodes 23 is arranged in a comb shape.

In the FET that configures the high-frequency switch circuit according to this embodiment, as shown in FIG. 7A, each of compensation capacitances Cdb11 is formed by setting the width of the drain electrode 22 to be wider than the width of the source electrode 21. In other words, as shown in FIGS. 7A and 8, a contact area between the drain electrode 22 and the body region 16 can be increased by setting the width (x) of the drain electrode 22 to be wider than the width of the source electrode 21. Thus, a depletion layer that is generated at the body region 16 by contacting the drain electrode 22 with the body region 16 can be increased. Therefore, the compensation capacitance Cdb11 can be formed as shown in the equivalent circuit diagram of FIG. 7B.

Also in the high-frequency switch circuit according to this embodiment, the compensation capacitance Cdb11 that compensates the parasitic capacitance Cbg11 due to the embedded oxide film between the body and the ground is formed between the drain D11 and the body B11. This configuration makes it possible to evenly absorb the symmetry breaking in which the symmetry of the capacitances of the FETs (T11 to T14), which are in the off-state and connected between the ANT terminal and the ground, with respect to the voltage applied between the ANT terminal and the ground is broken due to the parasitic capacitance Cbg11. In other words, it is possible to minimize the odd function component of the FETs (T11 to T14), which are in the off-state and connected in multistage between the ANT terminal and the ground, with respect to the voltage applied between the ANT terminal and the ground. This makes it possible to minimize the generation of the second-order harmonic distortion.

The first and second embodiments can be combined as desirable by one of ordinary skill in the art. For example, in the high-frequency switch circuit according to the present invention, the drain electrodes 22 can be formed on both sides of the body region 16b of the FET shown in FIG. 4 as described in the first embodiment, while setting the width of the drain electrodes 22 to be wider than the width of the source electrodes 21 of the FET shown in FIG. 8 as described in the second embodiment. This configuration makes it possible to further increase the contact area between the drain electrode and the body region. Therefore, the value of the compensation capacitance Cdb11 can further be increased.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A high-frequency switch circuit comprising:
   a first switch that is connected between a common terminal and a first terminal; and
   a second switch that is connected between the common terminal and a second terminal,
   wherein each of the first and second switches includes a plurality of field-effect transistors connected in series and each having a body, a source, a drain, and a gate,
   a compensation capacitance that compensates a parasitic capacitance generated when the first switch is in an off-state is formed between the drain and the body or between the source and the body in at least one of the plurality of field-effect transistors of the first switch, and
   a compensation capacitance that compensates a parasitic capacitance generated when the second switch is in an off-state is formed between the drain and the body or between the source and the body in at least one of the plurality of field-effect transistors of the second switch.

2. The high-frequency switch circuit according to claim 1, wherein a unit device of the field-effect transistors is a multi-finger type field-effect transistor that includes a plurality of body regions, a plurality of source and drain electrodes arranged on both sides of the plurality of body regions, a plurality of gate insulators respectively arranged on the plurality of body regions, and a plurality of gate electrodes respectively arranged on the plurality of gate insulators.

3. The high-frequency switch circuit according to claim 2, wherein the field-effect transistor is formed on an embedded oxide film, the body region is disposed between the embedded oxide film and the drain electrode and between the embedded oxide film and the source electrode, and the compensation capacitance is formed by setting a width of the drain electrode to be wider than a width of the source electrode or by having the width of the source electrode wider than the width of the drain electrode in the multi-finger type field-effect transistor.

4. The high-frequency switch circuit according to claim 2, wherein the compensation capacitance is formed by increasing a contact area between the body region and the drain electrode or by increasing a contact area between the body region and the source electrode.

5. The high-frequency switch circuit according to claim 2, wherein the compensation capacitance is formed by forming a body region having drain electrodes formed on both sides or by forming a body region having source electrodes formed on both sides in at least one of the multi-finger type field-effect transistors.

6. The high-frequency switch circuit according to claim 1, wherein the field-effect transistor is formed on an embedded oxide film.

7. The high-frequency switch circuit according to claim 1, wherein the compensation capacitance reduces an odd function component generated when a drain-to-source capacitance is expressed as a function with respect to a drain-to-source voltage, by compensating the parasitic capacitance generated between the body and a ground when the field-effect transistor is in an off-state.

8. The high-frequency switch circuit according to claim 1, wherein the compensation capacitances are formed in each of the field-effect transistors of the first and second switches.

9. The high-frequency switch circuit according to claim 1, wherein the high-frequency switch circuit switches on-state and off-state of any switch among switches connected between N (N is an integer) number of input terminals and M (M is an integer) number of output terminals.

10. A high-frequency switch circuit comprising:
a first switch that is connected between a common terminal and a first terminal; and
a second switch that is connected between the common terminal and a second terminal,
wherein each of the first and second switches includes a plurality of field-effect transistors connected in series and each having a body, a source, a drain, and a gate,
a compensation capacitance that compensates a parasitic capacitance generated when the first switch is in an off-state is formed between the drain and the body or between the source and the body in at least one of the plurality of field-effect transistors of the first switch, and a compensation capacitance that compensates a parasitic capacitance generated when the second switch is in an off-state is formed between the drain and the body or between the source and the body in at least one of the plurality of field-effect transistors of the second switch,
wherein a unit device of the field-effect transistors is a multi-finger type field-effect transistor that includes a plurality of body regions, a plurality of source and drain electrodes arranged on both sides of the plurality of body regions, a plurality of gate insulators respectively arranged on the plurality of body regions, and a plurality of gate electrodes respectively arranged on the plurality of gate insulators.

11. The high-frequency switch circuit according to claim 10, wherein the compensation capacitance is formed by increasing a contact area between the body region and the drain electrode or by increasing a contact area between the body region and the source electrode.

12. The high-frequency switch circuit according to claim 10, wherein the compensation capacitance is formed by forming a body region having drain electrodes formed on both sides or by forming a body region having source electrodes formed on both sides in at least one of the multi-finger type field-effect transistors.

13. The high-frequency switch circuit according to claim 10, wherein the field-effect transistor is formed on an embedded oxide film.

14. The high-frequency switch circuit according to claim 10, wherein the field-effect transistor is formed on an embedded oxide film, the body region is disposed between the embedded oxide film and the drain electrode and between the embedded oxide film and the source electrode, and the compensation capacitance is formed by setting a width of the drain electrode to be wider than a width of the source electrode or by having the width of the source electrode wider than the width of the drain electrode in the multi-finger type field-effect transistor.

15. The high-frequency switch circuit according to claim 10, wherein the compensation capacitance reduces an odd function component generated when a drain-to-source capacitance is expressed as a function with respect to a drain-to-source voltage, by compensating the parasitic capacitance generated between the body and a ground when the field-effect transistor is in an off-state.

16. The high-frequency switch circuit according to claim 10, wherein the compensation capacitances are formed in each of the field-effect transistors of the first and second switches.

17. The high-frequency switch circuit according to claim 10, wherein the high-frequency switch circuit switches on-state and off-state of any switch among switches connected between N (N is an integer) number of input terminals and M (M is an integer) number of output terminals.

* * * * *